United States Patent
D'Evelyn et al.

(10) Patent No.: US 9,175,418 B2
(45) Date of Patent: Nov. 3, 2015

(54) METHOD FOR SYNTHESIS OF HIGH QUALITY LARGE AREA BULK GALLIUM BASED CRYSTALS

(75) Inventors: Mark P. D'Evelyn, Goleta, CA (US); James S. Speck, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 1037 days.

(21) Appl. No.: 12/988,772

(22) PCT Filed: Oct. 11, 2010

(86) PCT No.: PCT/US2010/052175
§ 371 (c)(1),
(2), (4) Date: Jun. 30, 2011

(87) PCT Pub. No.: WO2011/044554
PCT Pub. Date: Apr. 14, 2011

(65) Prior Publication Data
US 2011/0256693 A1    Oct. 20, 2011

Related U.S. Application Data

(60) Provisional application No. 61/250,476, filed on Oct. 9, 2009.

(51) Int. Cl.
C30B 7/10 (2006.01)
C30B 25/02 (2006.01)
C30B 29/40 (2006.01)

(52) U.S. Cl.
CPC ............... *C30B 25/02* (2013.01); *C30B 7/105* (2013.01); *C30B 29/403* (2013.01); *C30B 29/406* (2013.01)

(58) Field of Classification Search
None
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | Von Platen |
| 5,098,673 A | 3/1992 | Engel et al. |
| 5,169,486 A | 12/1992 | Young et al. |
| 5,474,021 A | 12/1995 | Tsuno et al. |

(Continued)

FOREIGN PATENT DOCUMENTS

| | | |
|---|---|---|
| CN | 101061570 | 10/2007 |
| JP | H06-87691 | 3/1994 |

(Continued)

OTHER PUBLICATIONS

Chiang et al. "Luminescent Properties of Cerium-Activated Garnet Series Phosphor: Structure and Temperature Effects," Journal of the Electrochemical Society 155:B517-B520 (2008).

(Continued)

*Primary Examiner* — Anita Alanko
(74) *Attorney, Agent, or Firm* — Saul Ewing LLP

(57) ABSTRACT

A large area nitride crystal, comprising gallium and nitrogen, with a non-polar or semi-polar large-area face, is disclosed, along with a method of manufacture. The crystal is useful as a substrate for a light emitting diode, a laser diode, a transistor, a photodetector, a solar cell, or for photoelectrochemical water splitting for hydrogen generation.

22 Claims, 11 Drawing Sheets

(56) References Cited

U.S. PATENT DOCUMENTS

| | | | |
|---|---|---|---|
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 * | 7/2003 | Vaudo et al. ........ 117/97 |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,211,833 B2 | 5/2007 | Slater, Jr. et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,381,591 B2 | 6/2008 | Moden |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 8,871,024 B2 | 10/2014 | D'Evelyn |
| 8,878,230 B2 | 11/2014 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0021582 A1 | 2/2006 | Saito et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |

(56) References Cited

U.S. PATENT DOCUMENTS

| | | |
|---|---|---|
| 2006/0246687 A1 | 11/2006 | Kaiser et al. |
| 2006/0255341 A1 | 11/2006 | Pinnington et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0213593 A1 | 8/2009 | Foley et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1* | 12/2009 | Letts et al. .................... 257/76 |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0203514 A1 | 8/2011 | Pimputkar et al. |
| 2011/0220912 A1 | 9/2011 | D'Evelyn |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 10-032348 | 2/1998 |
| JP | 2002-513375 | 5/2002 |
| JP | 2005-289797 A2 | 10/2005 |
| JP | 2005-298269 | 10/2005 |
| JP | 2006-315947 | 11/2006 |
| JP | 2007-039321 A | 2/2007 |
| JP | 2008-133151 | 6/2008 |
| JP | 2008-521737 | 6/2008 |
| JP | 2008-222519 | 9/2008 |
| JP | 2009-071287 | 4/2009 |
| JP | 2009-520678 | 5/2009 |
| JP | 2009-527913 | 7/2009 |
| JP | 2009-286652 | 12/2009 |
| JP | 2010-010705 | 1/2010 |
| JP | 2010-047463 | 3/2010 |
| JP | 2012-512119 | 5/2012 |
| WO | WO 2004/030061 | 4/2004 |
| WO | WO 2004/061923 | 7/2004 |
| WO | WO 2005121415 A1 | 12/2005 |
| WO | WO 2006/038467 | 4/2006 |
| WO | 2006/057463 | 6/2006 |
| WO | WO2007-004495 | 1/2007 |
| WO | WO 2010/068916 | 6/2010 |
| WO | WO2012-016033 | 2/2012 |

OTHER PUBLICATIONS

Chiu et al. "Synthesis and Luminescence Properties of Intensely Red-Emitting $M_5Eu(WO_4)_{4-x}(MoO_4)_x$ (M=Li, Na, K) Phosphors," Journal of the Electrochemical Society 15:J71-J78 (2008).

Ci et al. "$Ca_{1-x}Mo_{1-y}Nb_yO_4:Eu_x^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

(56) References Cited

OTHER PUBLICATIONS

Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8$:$Eu_2$+ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$—Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

Communication from the Chinese Patent Office re 200980154756.9 dated Jun. 17, 2014 (10 pages).

USPTO Office Action for U.S. Appl. No. 12/484,095 dated Aug. 29, 2014 (10 pages).

USPTO Notice of Allowance for U.S. Appl. No. 13/013,697 dated Aug. 27, 2014 (5 pages).

USPTO Notice of Allowance for U.S. Appl. No. 13/041,199 dated Sep. 9, 2014 (9 pages).

USPTO Office Action for U.S. Appl. No. 13/160,307 dated Jun. 26, 2014 (19 pages).

USPTO Office Action for U.S. Appl. No. 13/894,220 dated Jul. 31, 2014 (9 pages).

International Search Report and Written Opinion for PCT application PCT/US10/52175 (Jan. 6, 2011).

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820- L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on $m$-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Wang et al. "Ammonothermal growth of GaN crystals in alkaline solutions," Journal of crystal Growth 287:376-380 (Jan. 2006).

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Lide et al., 'Thermal Conductivity of Ceramics and Other Insulating Materials,' CRC Handbook of Chemistry and Physics, 91st Edition, 2010-2011, pp. 12-203 and 12-204.

(56) References Cited

OTHER PUBLICATIONS http://www.matbase.com/material/non-ferrous-metals/other/molybdenum/properties, Data Table for: Non-Ferrous Metals: Other Metals: Molybdenum.
Pattison et al., 'Gallium Nitride Based Microcavity Light Emitting Diodes With 2λ Effective Cavity Thickness', Applied Physics Letters, vol. 90, Issue 3, 031111 (2007) 3pg.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,844 dated Sep. 16, 2010.
USPTO Office Action for U.S. Appl. No. 12/534,844 dated Feb. 2, 2011.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.

Altoukhov et al., 'High reflectivity airgap distributed Bragg reflectors realized by wet etching of AlInN sacrificial layers', Applied Physics Letters, vol. 95, 2009, pp. 191102-1-191102-3.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, ' Bulk GaN Ion Cleaving', Journal of Electronic Materials, vol. 39, 2010, pp. 482-488.
Oshima et al., 'Thermal and optical properties of bulk GaN crystals fabricated through hydride vapor phase epitaxy with void-assisted separation', Journal of Applied Physics, 98, 2005, pp. 103509-1-103509-4.
International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
USPTO Office Action for U.S. Appl. No. 12/133,365 dated May 13, 2013.
USPTO Office Action for U.S. Appl. No. 12/497,969 dated May 16, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
USPTO Notice of Allowance for U.S. Appl. No. 12/534,843 dated Jan. 24, 2013.
Communication from the Polish Patent Office re P394857 dated Jan. 22, 2013, 2 pages.
USPTO Notice of Allowance for U.S. Appl. No. 12/634,665 dated Feb. 15, 2013.
USPTO Office Action for U.S. Appl. No. 13/041,199 dated Mar. 12, 2013.
USPTO Notice of Allowance for U.S. Appl. No. 13/226,249 dated Feb. 21, 2013.
USPTO Office Action for U.S. Appl. No. 12/133,365 dated Feb. 20, 2014, 32 pages.

(56) References Cited

OTHER PUBLICATIONS

USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
USPTO Office Action for U.S. Appl. No. 13/472,356 dated Dec. 9, 2013 (11 pages).
Choi et al., '2.51 microcavity InGaN light-emitting diodes fabricated by a selective dry-etch thinning process', Applied Physics Letters, 2007, 91(6), 061120.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Notice of Allowance for U.S. Appl. No. 12/478,736 dated Oct. 9, 2012.
USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Oct. 1, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
Roder et al., 'Temperature dependence of the thermal expansion of GaN', Physics Review B, vol. 72., No. 085218, Aug. 24, 2005, (6 pages).
USPTO Office Action for U.S. Appl. No. 13/013,697 dated Jun. 9, 2014 (5 pages).
USPTO Office Action for U.S. Appl. No. 13/041,199 dated Apr. 29, 2014 (12 pages).
Office action for U.S. Appl. No. 12/497,969 (Feb. 2, 2012).
Office action for U.S. Appl. No. 12/476,736 (Feb. 7, 2012).
Office action for U.S. Appl. No. 12/569,841 (Dec. 23, 2011).
Office action for U.S. Appl. No. 12/724,933 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).
Copel et al., 'Surfactants in Epitaxial Growth', Physical Review Letters, Aug. 7, 1989, vol. 63, No. 6, p. 632-635.
Lu et al., 'Structure of the Cl-passivated GaAs(111) surface', Physical Review B, Nov. 15, 1998, vol. 58, No. 20, pp. 13820-13823.
Massies et al., 'Surfactant mediated epitaxial growth of InxGa1—xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.

Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/272,981 dated Aug. 15, 2013, 13 pages.
Sarva et al. "Dynamic compressive strength of silicon carbide under uniaxial compression," Mat. Sci. & Eng. A 317,140 (2001).
Amano et al., 'Metalorganic Vapor Phase Epitaxial Growth of a High Quality GaN Film Using an AlN Buffer Layer', Applied Physics Letter, vol. 48, No. 5, 1986, pp. 353-355.
Baker et al., 'Characterization of Planar Semipolar Gallium Nitride Films on Spinel Substrates', Japanese Journal of Applied Physics, vol. 44, No. 29, 2005, pp. L920-L922.
Baker et al., 'Characterization of Planar Semipolar Gallium Nitride Films on Sapphire Substrates', Japanese Journal of Applied Physics, vol. 45, No. 6, 2006, pp. L154-L157.
Cantu et al., 'Si Doping Effect on Strain Reduction in Compressively Strained Al0.49Ga0.51N Thin Films', Applied Physics Letter, vol. 83, No. 4, 2003, pp. 674-676.
Chakraborty et al., 'Defect Reduction in Nonpolar a-Plane GaN Films Using in situ SiNx Nanomask', Applied Physics Letters, vol. 89, 2006, pp. 041903-1-041903-3.
Corrion et al., 'Structural and Morphological Properties of GaN Buffer Layers Grown by Ammonia Molecular Beam Epitaxy on SiC Substrates for AlGaN/GaN High Electron Mobility Transistors', Journal of Applied Physics, vol. 103, No. 9, 2008, pp. 093529-1-093529-7.
Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.
Grandjean et al., 'Nitridation of Sapphire, Effect on the Optical Properties of GaN Epitaxial Overlayers', Applied Physics Letters, vol. 69, No. 14, 1996, pp. 2071-2073.
Green et al., 'Polarity Control During Molecular Beam Epitaxy Growth of Mg-Doped GaN', Journal of Vacuum Science Technology, vol. B-21, No. 4, 2003, pp. 1804-1811.
Hellman, 'The Polarity of GaN: A Critical Review', MRS Internet Journal Nitride Semiconductor Research, vol. 3, No. 11, 1998, pp. 1-11.
Heying et al., 'Control of GaN Surface Morphologies Using Plasma-Assisted Molecular Beam Epitaxy', Journal of Applied Physics, vol. 88, No. 4, 2000, pp. 1855-1860.
Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.
Keller et al., 'Influence of Sapphire Nitridation on Properties of Gallium Nitride Grown by Metalorganic Chemical Vapor Deposition', Applied Physics Letters, vol. 68, No. 11, 1996, pp. 1525-1527.
Keller et al., 'Influence of the Substrate Misorientation on the Properties of N-Polar GaN Films Grown by Metal Organic Chemical Vapor Deposition', Journal of Applied Physics, vol. 102, 2007, pp. 083546-1-083546-6.
Koblmuller et al., 'In Situ Investigation of Growth Modes During Plasma-Assisted Molecular Beam Epitaxy of (0001) GaN', Applied Physics Letters, vol. 91, 2007, pp. 161904-1-161904-3.
Koblmuller et al., 'High Electron Mobility GaN Grown Under N-Rich Conditions by Plasma-Assisted Molecular Beam Epitaxy', Applied Physics Letters, vol. 91, 2007, pp. 221905-1-221905-3.

(56) References Cited

OTHER PUBLICATIONS

Manfra et al., 'Dislocation and Morphology Control During Molecular-Beam Epitaxy of AlGaN/GaN Heterostructures Directly on Sapphire Substrates', Applied Physics Letters, vol. 81, No. 8, 2002, pp. 1456-1458.
Marchand et al., 'Microscructure of GaN Laterally Overgrown by Metalorganic Chemical Vapor Deposition', Applied Physics Letters, vol. 73, No. 6, 1998, pp. 747-749.
Nakamura et al., 'GaN Growth Using GaN Buffer Layer', Japanese Journal of Applied Physics, vol. 30, No. 10A, 1991, pp. L1705-L1707.
Park et al., 'Selective-Area and Lateral Epitaxial Overgrowth of III-N Materials by Metal Organic Chemical Vapor Deposition', Applied Physics Letters, vol. 73, No. 3, 1998, pp. 333-335.
International Search Report of PCT Application No. PCT/US2009/048489, dated Sep. 14, 2009, 12 pages total.
International Search Report & Written Opinion of PCT Application No. PCT/US2009/046252, dated Jul. 29, 2009, 12 pages total.
International Search Report of PCT Application No. PCT/US2009/049725, dated Sep. 1, 2009, 17 pages total.
International Search Report & Written Opinion of PCT Application No. PCT/US2009/054952, dated Oct. 21, 2009, 15 pages total.
International Search Report & Written Opinion of PCT Application No. PCT/U52009/056546, dated Nov. 2, 2009, 13 pages total.
Romanov et al., 'Stress Relaxation in Mismatched Layers Due to Threading Dislocation Inclination', Applied Physics Letter, vol. 83, No. 13, 2003, pp. 2569-2571.
Stutzmann et al., 'Playing With Polarity', Physics Status Solidi, vol. 228, No. 2, 2001, pp. 505-512.
Sumiya et al., 'Growth Mode and Surface Moiphology of a GaN Film Deposited Along the N-Face Polar Direction on c-Plane Sapphire Substrate', Journal of Applied Physics, vol. 88, No. 2, 2000, pp. 1158-1165.
Sumiya et al., 'Review of Polarity Determination and Control of GaN', MRS Internet Journal Nitride Semiconductor Research, vol. 9, No. 1, 2004, pp. 1-34.
Communication from the Japanese Patent Office re 2011-053647 dated Sep. 17, 2014 (8 pages).
Waltereit et al., 'Structural Properties of GaN Buffer Layers on 4H-SiC(0001) Grown by Plasma-Assisted Molecular Beam Epitaxy for High Electron Mobilty Transistors', Japanese Journal of Applied Physics, vol. 43, No. 12-A, 2004, pp. L1520-L1523.
Weyher et al., 'Morphological and Structural Characteristics of Homoepitaxial GaN Grown by Metalorganic Chemical Vapour Deposition (MOCVD)', Journal of Crystal Growth, vol. 204, 1999, pp. 419-428.
Xu et al., 'Polarity Control of GaN Grown on Sapphire Substrate by RF-MBE', Journal of Crystal Growth, vol. 237-239, Pt. 2, 2002, pp. 1003-1007.
USPTO Office Action for U.S. Appl. No. 12/636,683 dated Nov. 17, 2014 (16 pages).
USPTO Office Action for U.S. Appl. No. 13/343,563 dated Oct. 8, 2014 (5 pages).
USPTO Office Action for U.S. Appl. No. 13/538,426 dated Nov. 21, 2014 (15 pages).
USPTO Notice of Allowance for U.S. Appl. No. 13/894,220 dated Dec. 9, 2014 (8 pages).
Communication from the Japanese Patent Office re 2011-134782 dated Dec. 26, 2014 (9 pages).
USPTO Notice of Allowance for U.S. Appl. No. 13/343,563 dated Dec. 17, 2014 (7 pages).
USPTO Office Action for U.S. Appl. No. 13/538,426 dated Mar. 19, 2015 (16 pages).
USPTO Office Action for U.S. Appl. No. 13/556,105 dated Mar. 13, 2015 (6 pages).

\* cited by examiner

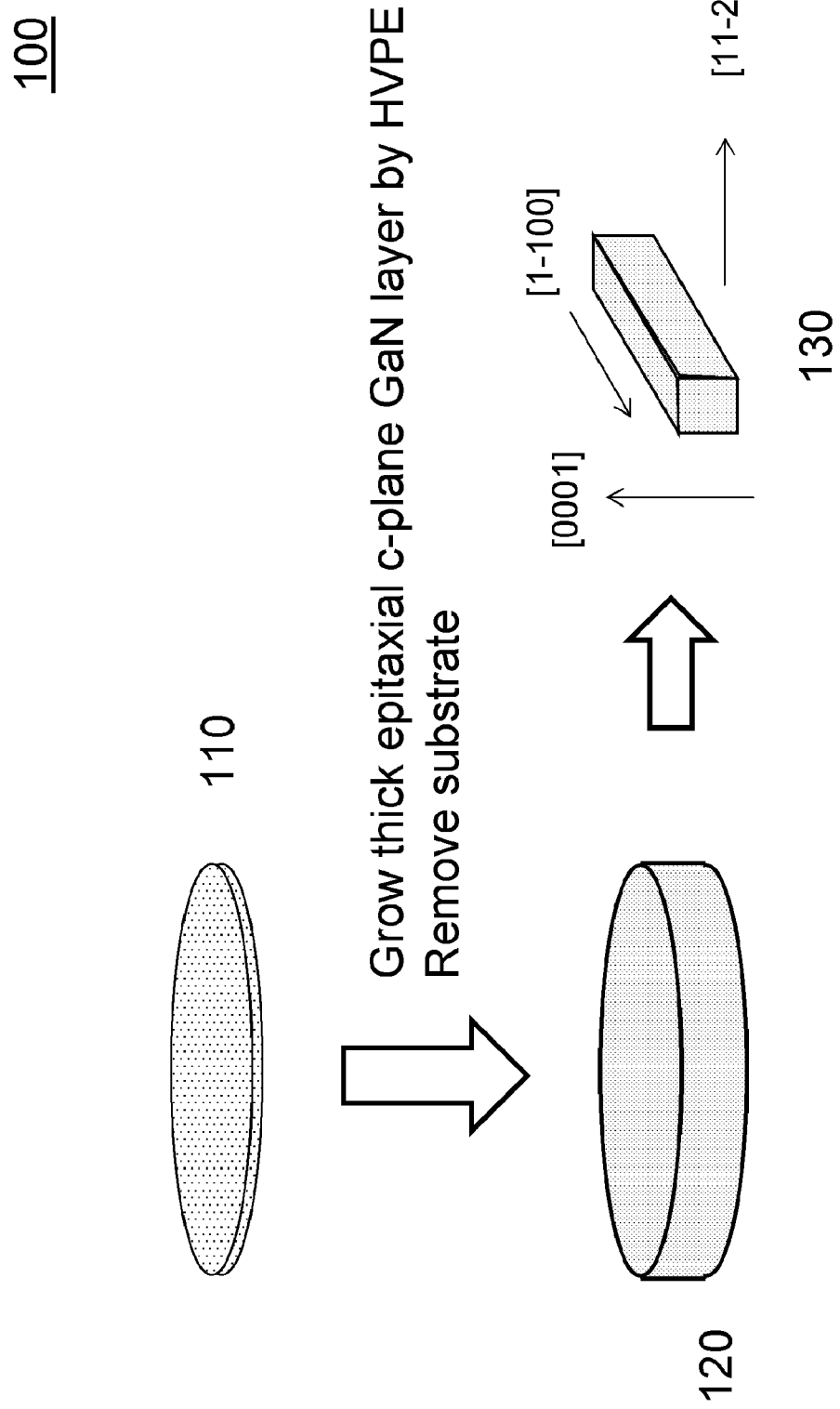
Fig. 1a – Proto-seed

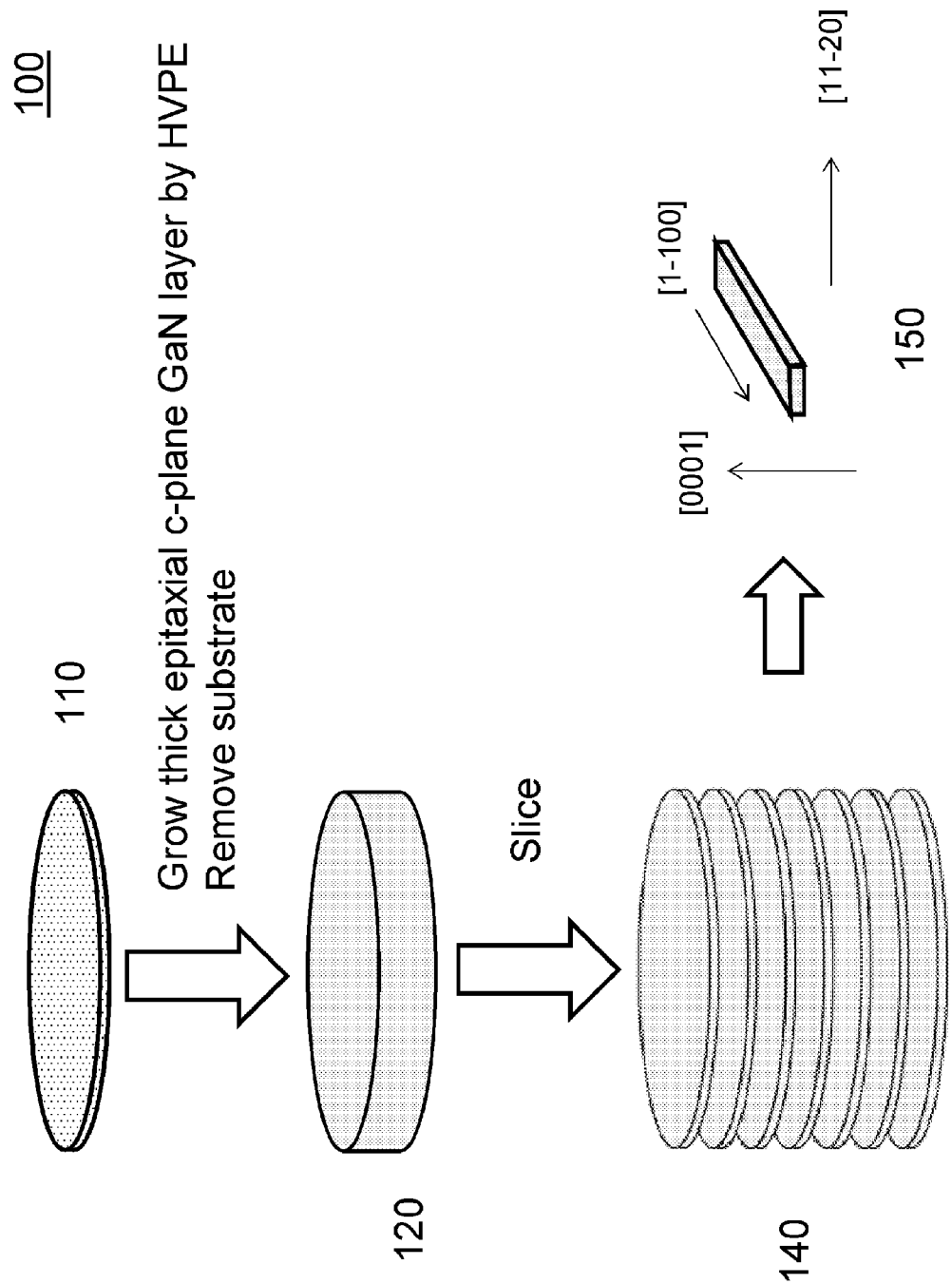

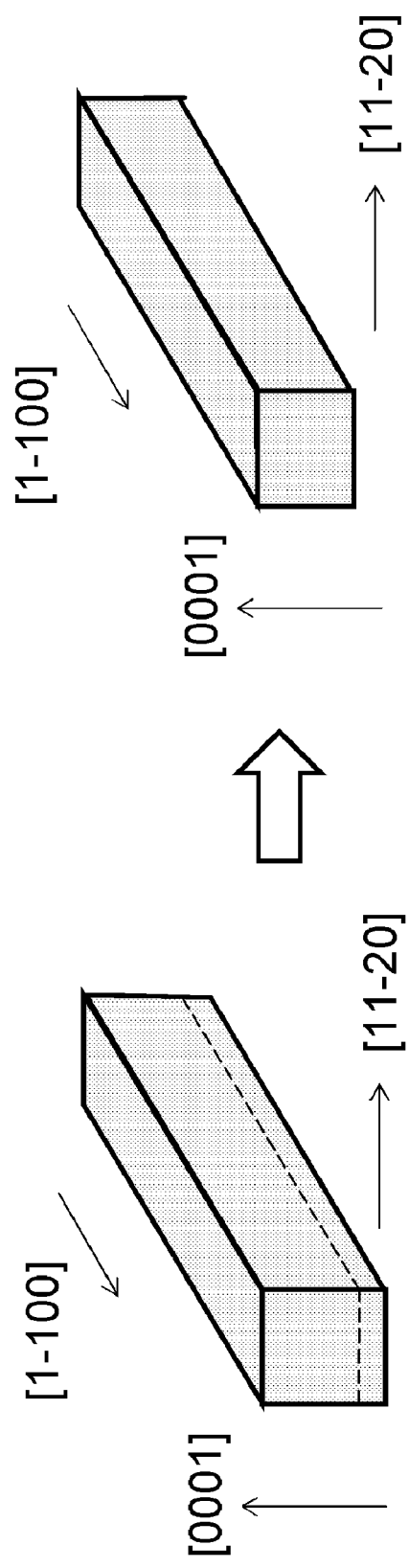
Fig. 2 – Optional step: trim –c edge

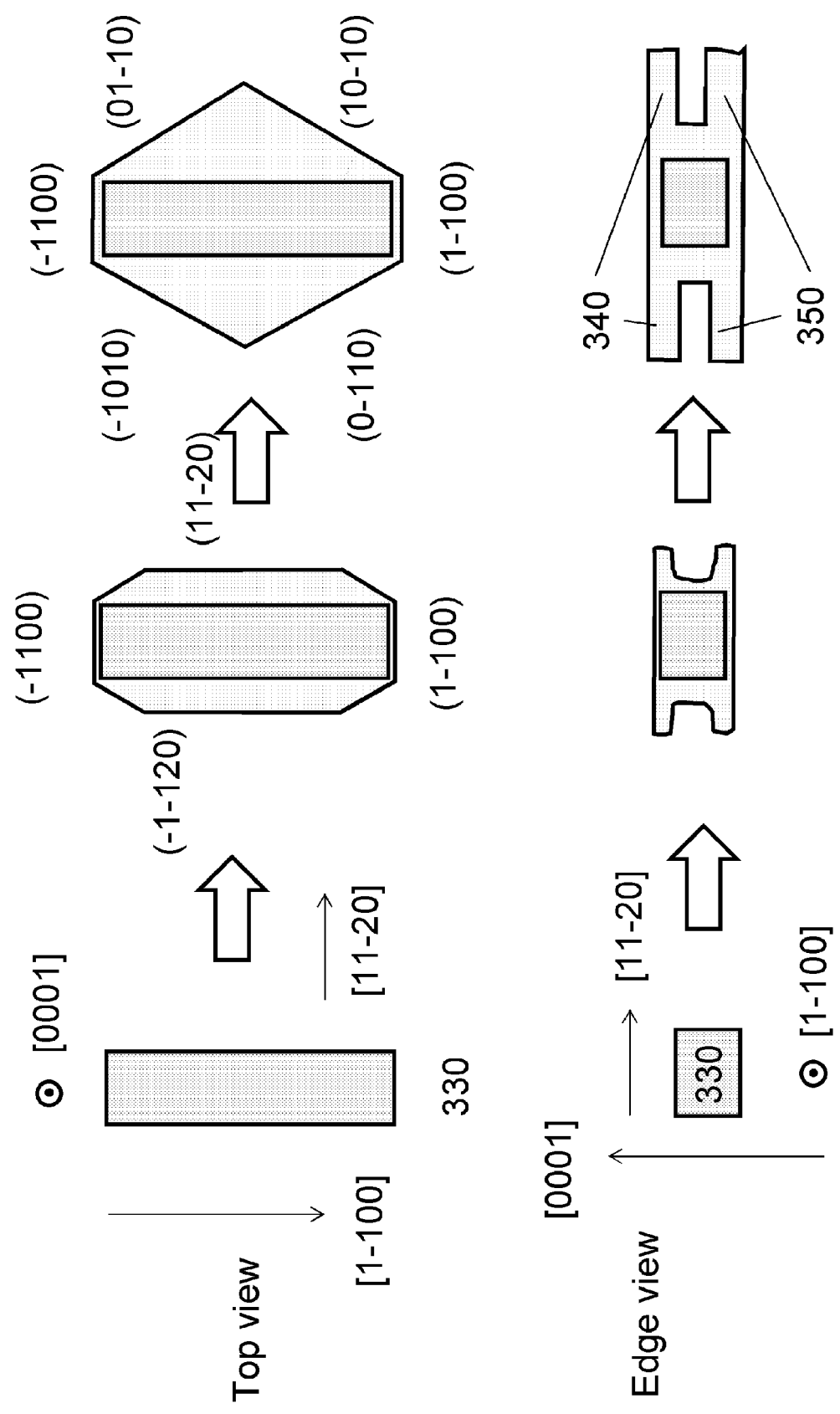

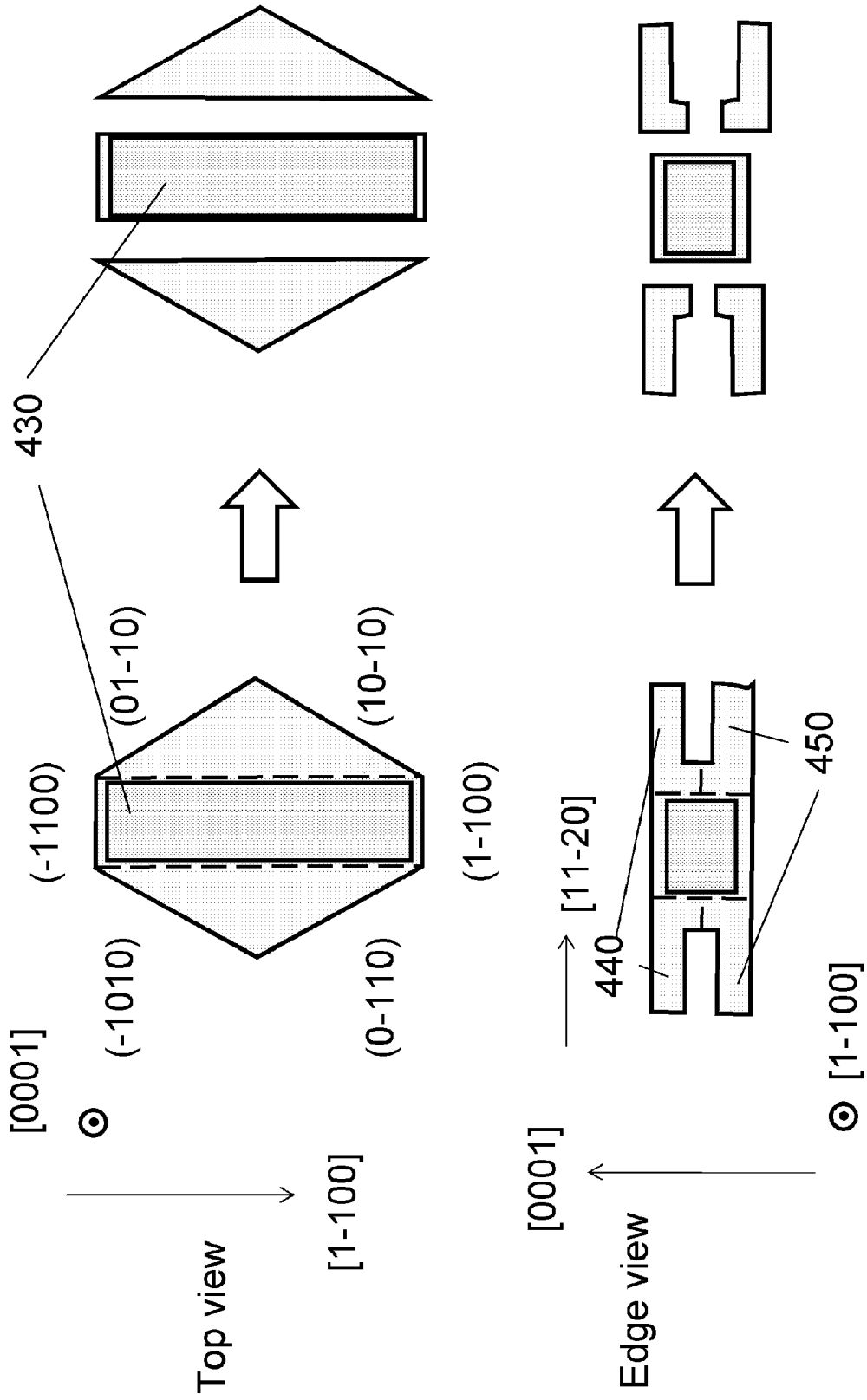

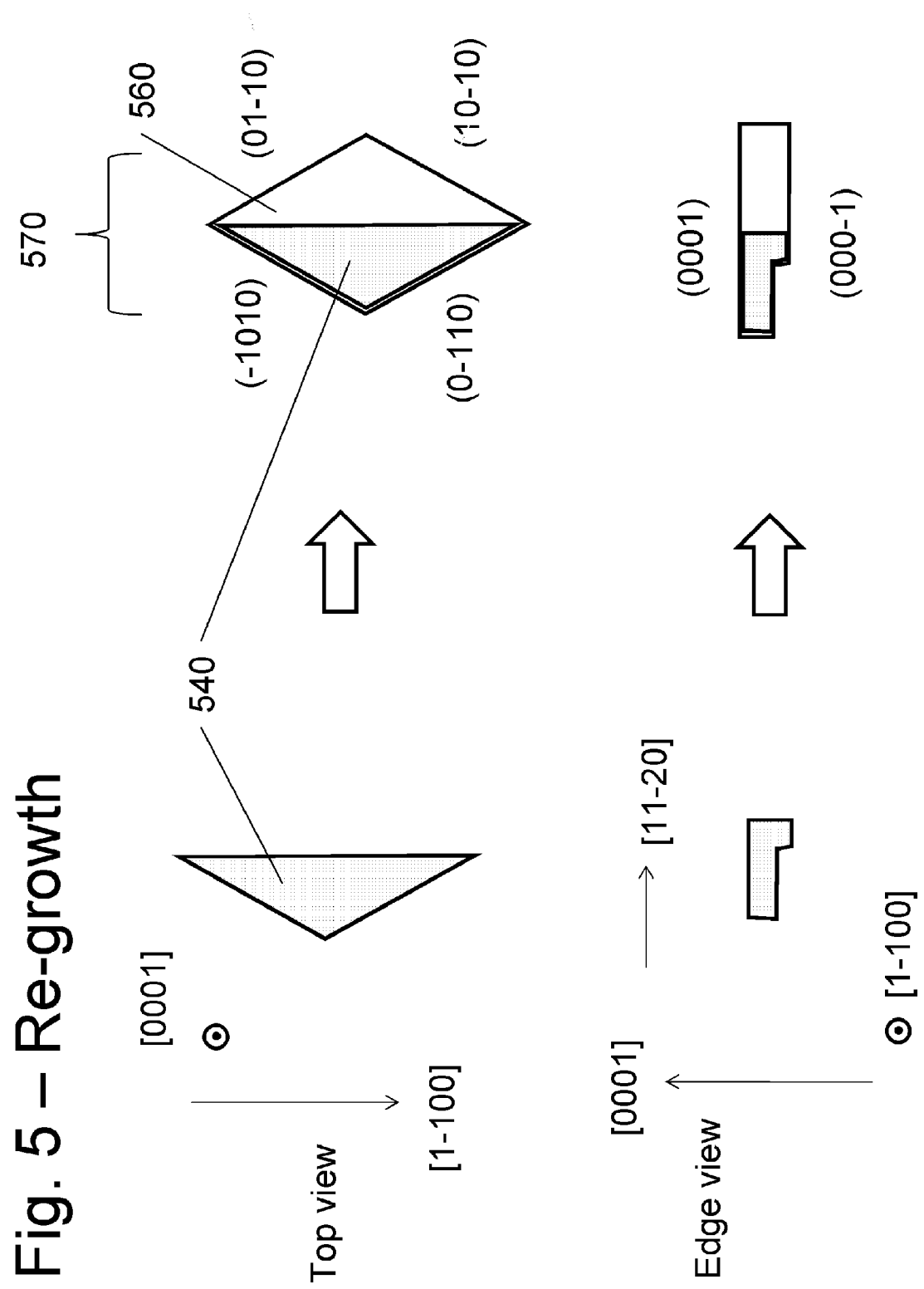
Fig. 5 – Re-growth

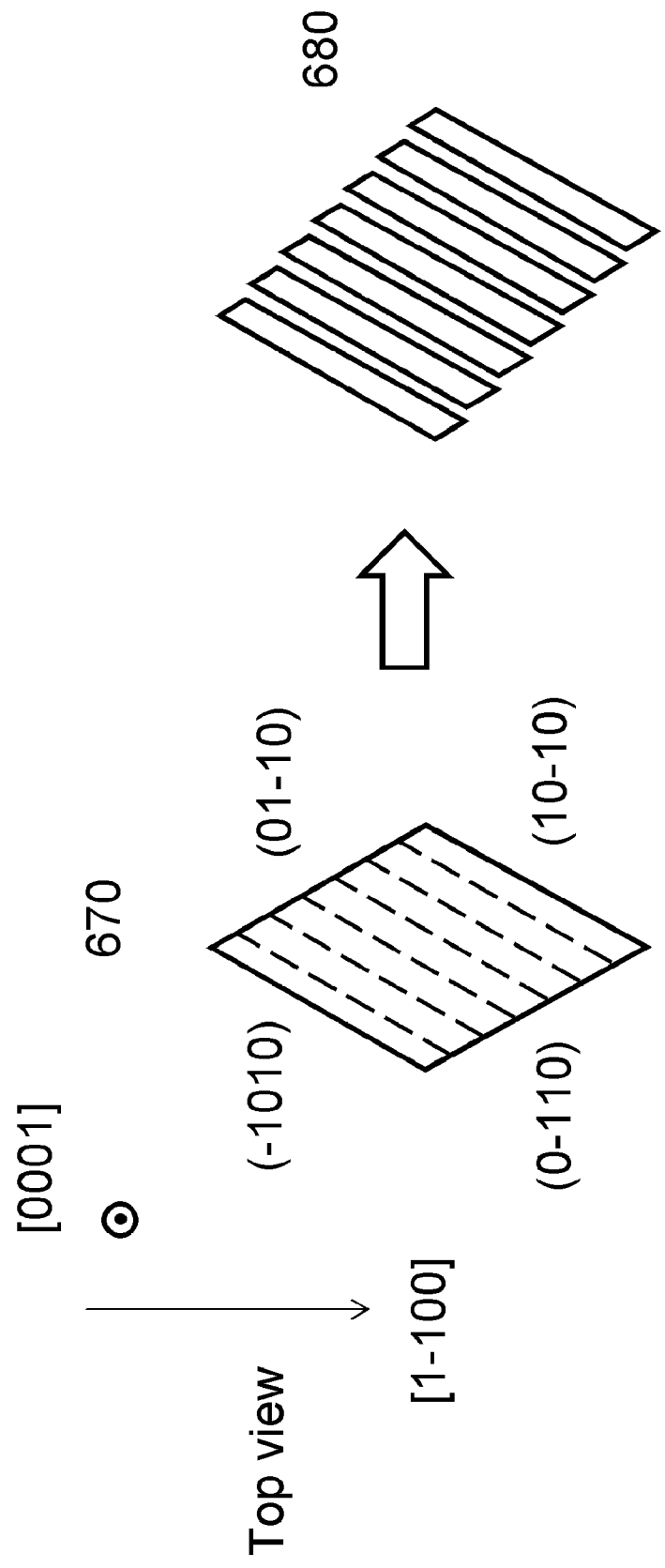
Fig. 6 – Optional separation

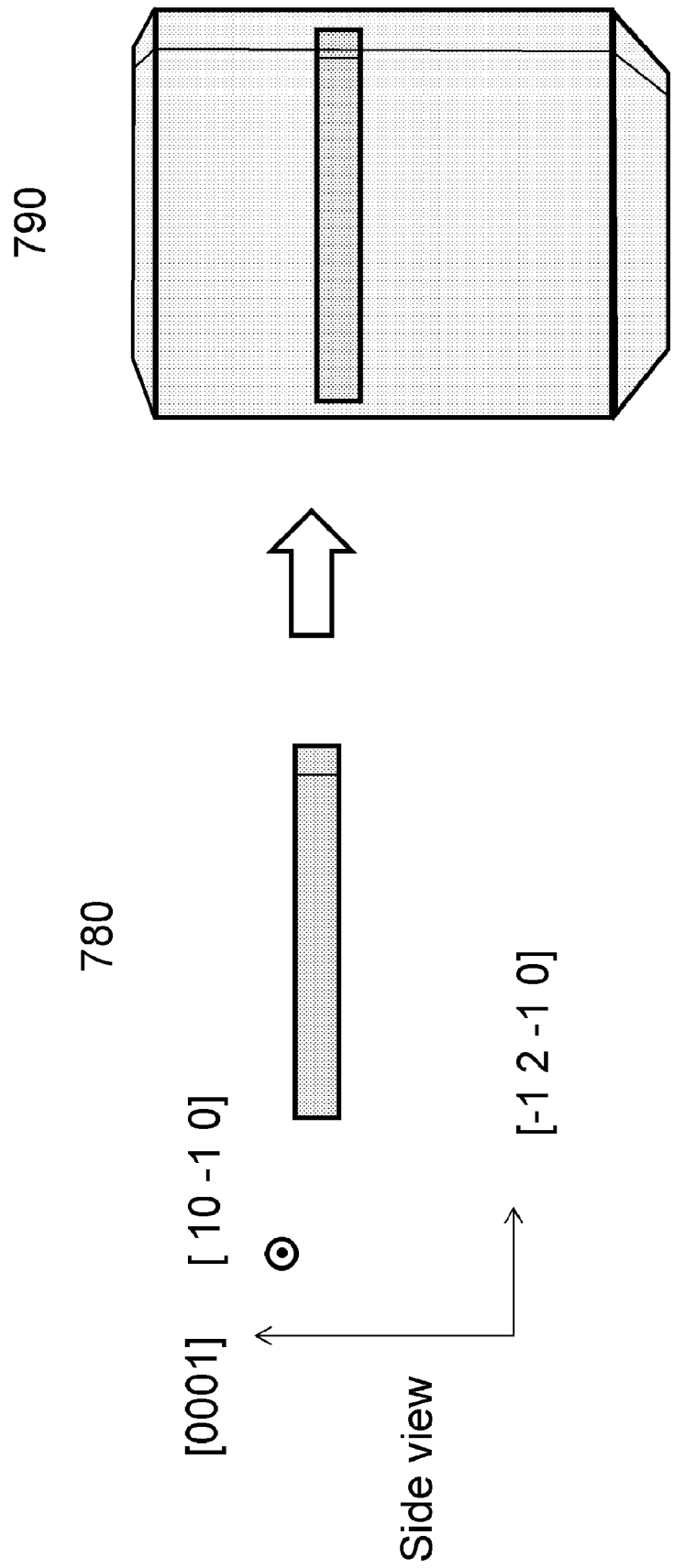
Fig. 7a – C-direction growth

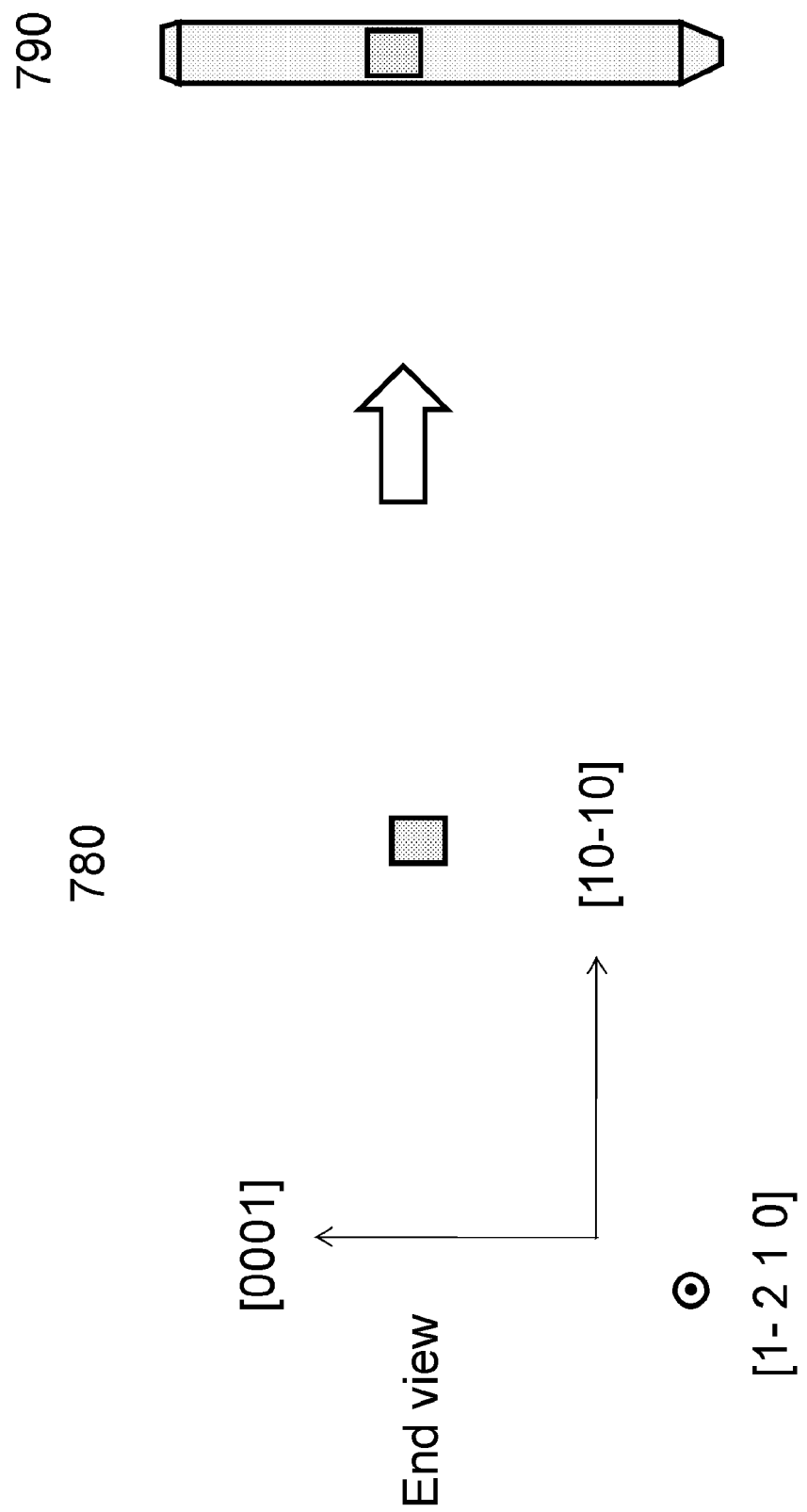

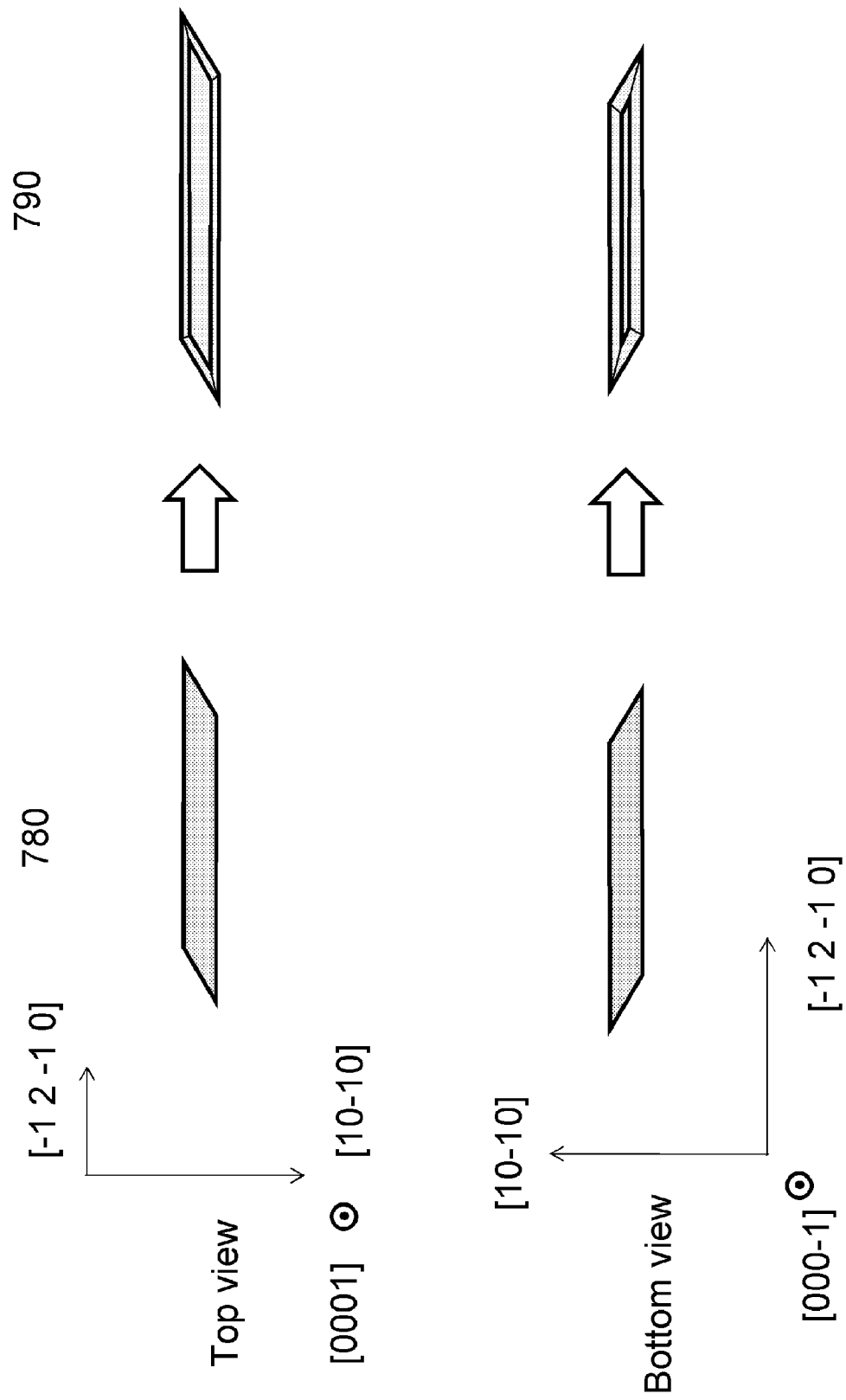

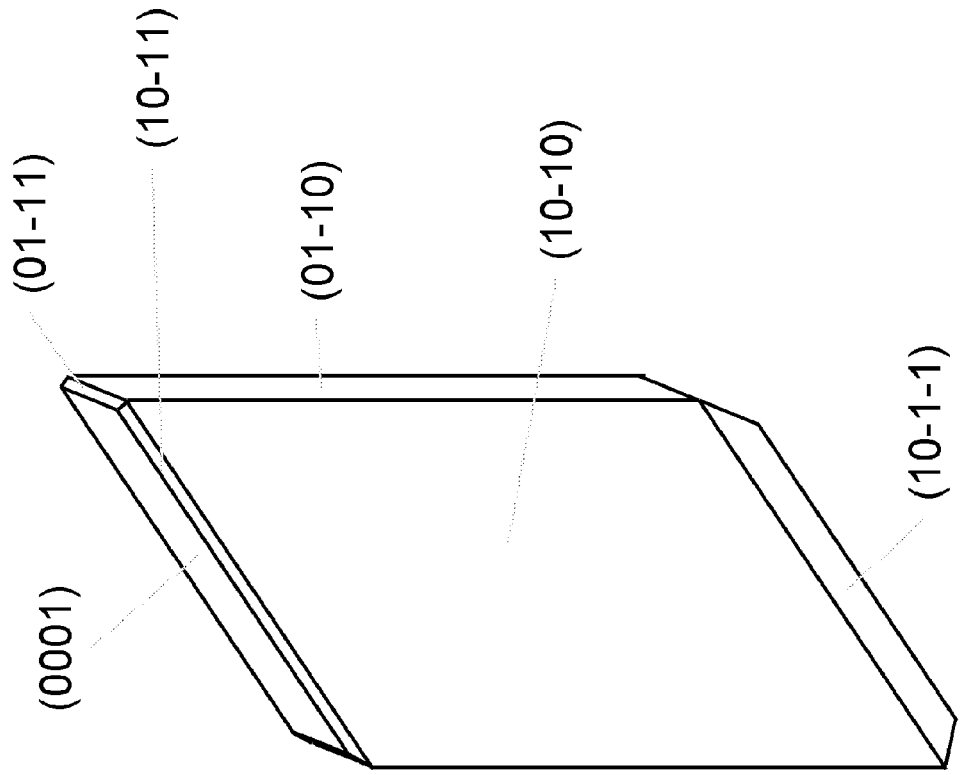
Fig. 8 – Morphology of grown crystal

METHOD FOR SYNTHESIS OF HIGH QUALITY LARGE AREA BULK GALLIUM BASED CRYSTALS

CROSS-REFERENCE TO RELATED APPLICATION

This application claims priority to U.S. Provisional No. 61/250,476, filed Oct. 9, 2009, commonly assigned, and hereby incorporated by reference herein.

BACKGROUND OF THE INVENTION

This invention relates generally to techniques for processing materials for manufacture of gallium based substrates. More specifically, embodiments of the invention include techniques for growing large area substrates using a combination of processing techniques. The invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth method of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area c-plane gallium nitride crystals, typically with a (0001) orientation. The large-area c-plane gallium nitride crystals generally come in 2 inch diameter, free-standing (0001) GaN substrates and are generally available commercially. However, the quality of these crystals is not high enough for some applications. In addition, there is a need to synthesis gallium nitride crystals and wafers that are larger. Several conventional methods are capable of growing high quality gallium nitride boules from high quality gallium nitride seed crystals. However, gallium nitride seed crystals of sufficient size and quality are not available.

From the above, it is seen that techniques for improving crystal growth are highly desirable.

BRIEF SUMMARY OF THE INVENTION

According to the present invention, techniques related to techniques for processing materials for manufacture of gallium based substrates are provided. More specifically, embodiments of the invention include techniques for growing large area substrates using a combination of processing techniques. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a specific embodiment, the present invention provides a method for forming a gallium based crystal. The method includes providing a proto-seed, which has a gallium based crystal with a maximum length of at least 25 mm and a first thickness substantially orthogonal to a first direction of the maximum length and a second thickness orthogonal to the first direction of the maximum length. In a specific embodiment, each of the first thickness and the second thickness is at least 0.5 mm. In a specific embodiment, the method also includes subjecting the proto-seed to an ammonothermal growth of a gallium based crystalline material to cause the proto-seed to grow in a second direction lateral to the first direction of maximum length by a distance of at least 5 mm to form at least one a-wing, comprising a c+ surface and a c-surface. In a specific embodiment, each of the c+ surface and the c-surface has an area of at least 25 $mm^2$. As used herein, the term "lateral" is used in conjunction with a reference direction as shown or other interpretations known by one of ordinary skill in the art. As an example, the term lateral means a direction normal to the original crystal growth direction or other interpretations known by one of ordinary skill in the art. As an example, the proto-seed is a type of seed formed by removing a seed crystal structure from a thick gallium and nitrogen containing substrate made using HYPE growth, is formed by removing a seed crystal structure from a thick gallium and nitrogen containing substrate made using ammonothermal growth, or other techniques.

In a specific embodiment, the present method and resulting device combines several bulk growth methods to grow large area non-polar and semi-polar GaN substrates with high crystalline quality without the characteristic defects associated with epitaxial lateral overgrowth.

In an alternative specific embodiment, the present invention provides a method for forming a gallium based crystal, which may be used for other applications. The method includes providing a laterally grown gallium based seed crystal, which has a maximum length of at least 25 mm and a first thickness substantially orthogonal to a first direction of the maximum length and a second thickness orthogonal to the first direction of the maximum length. Each of the first thickness and the second thickness is at least 0.3 mm. The method includes subjecting the laterally grown gallium based seed crystal to an ammonothermal growth of a gallium based crystalline material to cause the laterally grown gallium based seed crystal to grow in a second direction lateral to the first direction of maximum length by a distance of at least 5 mm to form a c-grown crystal comprising two large-area m-orientation surfaces. Each of the m-surfaces has an area of at least 25 $mm^2$ in a specific embodiment.

In other embodiments, the present invention provides a gallium based crystal device comprising at least four m-plane faces and two c-plane faces; wherein the two c-plane faces are substantial major planes in association with any of the four m-plane faces. In other embodiments, the device also has at least two $\{1\ 0\ -1\ \pm1\}$ facets.

Still further, the present invention provides a seed crystal device for use in electronic or optical devices. The seed crystal device includes a seed crystal structure removed from a thickened gallium and nitrogen containing substrate provided from an HVPE grown material; wherein the thickened gallium and nitrogen substrate is at least 500 microns thick. Preferably, the device has at least a pair of major c-plane surfaces.

Moreover, the present invention provides a gallium and nitrogen crystalline structure comprising a laterally grown gallium and nitrogen containing material having a dislocation density of 105 cm-2 and less for a major surface and a major length of 12 mm and greater, the major length associated with the major surface, e.g., a c-plane, an m-plane.

A further understanding of the nature and advantages of the present invention may be realized by reference to the specification and attached drawings.

BRIEF DESCRIPTION OF THE DRAWINGS

FIG. 1a is a simplified diagram illustrating a method of forming a proto-seed crystal according to an embodiment of the present invention;

FIG. 1b is a simplified diagram illustrating a method of forming a proto-seed crystal according to an embodiment of the present invention;

FIG. 2 is a simplified diagram illustrating an optional step of forming a large area GaN crystal according to an embodiment of the present invention;

FIG. 3 is a simplified diagram illustrating a lateral growth process in the a-direction for forming a large area GaN crystal according to an embodiment of the present invention;

FIG. 4 is a simplified diagram illustrating a separation step for forming a large area GaN crystal according to an embodiment of the present invention;

FIG. 5 is a simplified flow diagram illustrating a re-growth step for forming a large area GaN crystal according to an embodiment of the present invention.

FIG. 6 is a simplified diagram illustrating an optional separation step for forming a strip-shaped GaN crystal according to an embodiment of the present invention;

FIG. 7a is a simplified diagram illustrating a side view of a lateral growth process in the c-direction for forming a large area GaN crystal according to an embodiment of the present invention;

FIG. 7b is a simplified diagram illustrating an edge view of a lateral growth process in the c-direction for forming a large area GaN crystal according to an embodiment of the present invention;

FIG. 7c is a simplified diagram illustrating top and bottom views of a lateral growth process in the c-direction for forming a large area GaN crystal according to an embodiment of the present invention; and FIG. 8 is a simplified diagram illustrating a representative crystal morphology following a lateral growth process in the c-direction for forming a large area GaN crystal according to an embodiment of the present invention.

DETAILED DESCRIPTION OF THE INVENTION

According to the present invention, techniques related to techniques for processing materials for manufacture of gallium based substrates are provided. More specifically, embodiments of the invention include techniques for growing large area substrates using a combination of processing techniques. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

D'Evelyn and co-inventors, in U.S. Pat. No. 7,078,731, hereby incorporated by reference in its entirety, taught methods for growing gallium nitride crystals. We have found that these methods have some limitations. FIG. 5 in this reference and the associated discussion in Col. 10, lines 24-41 teach a method for growing gallium nitride crystals with a low dislocation density that are substantially free of tilt boundaries. Practically speaking, this method requires prolonged growth in directions lateral to the c plane. The family of m planes are typically the slowest-growing facet under ammonothermal growth conditions, so that after long-duration growth the crystals are terminated by m planes in lateral directions, enlargement occurs by means of m-plane growth, and the rate of enlargement is undesirably low. To achieve a crystal diameter of 3 inches, 4 inches, 6 inches, 8 inches, or 12 inches, therefore, may require an impractically long period of time. D'Evelyn also taught lateral enlargement of crystals via growth in the a-direction (see FIG. 11 and the associated discussion in Col. 26, Example 9). However, the HVPE wafers that are commonly used as seed crystals for ammonothermal growth [for example, see M. P. D'Evelyn et al., Mat. Res. Soc. Symp. Proc. 798, Y2.3.1 (2004) and M. P. D'Evelyn et al., J. Cryst. Growth 300, 11 (2007)] may have substantial stresses, strain gradients and bow, which can cause irregular growth and cracking in the laterally-grown GaN material, particularly when the lateral dimensions are large, for example, larger than 2 inches.

FIG. 1a is a simplified diagram 100 illustrating a method for forming a GaN proto-seed crystals. A thick GaN layer is grown on substrate 110 using hydride vapor phase epitaxy (HVPE) or another method that is known in the art, forming boule 120. Substrate 110 may comprise sapphire, silicon carbide, gallium arsenide, $MgAl_2O_4$ spinel, gallium nitride, aluminum nitride, or the like. In a specific embodiment, substrate 110 may be selected from c-plane GaN, c-plane AlN, c-plane sapphire, spinel $MgAl_2O_4$ (111), GaAs(111), Si(111), any combination of these, or the like. Substrate 110 may have a hexagonal crystal structure, with a (0001) c-plane large-area surface orientation. In a specific embodiment, portions of substrate 110 are masked prior to growth of boule 120, enabling growth of material with a reduced dislocation density. In a preferred embodiment, boule 120 has a c-plane orientation and is at least 1 millimeter, at least 2 millimeters, at least 5 millimeters, at least 10 millimeters, at least 15 millimeters, or at least 20 millimeters thick. Substrate 110 and boule 120 may have a diameter that is larger than 25 millimeters, larger than 50 millimeters, larger than 100 millimeters, larger than 150 millimeters, larger than 200 millimeters, or larger than 300 millimeters. Boule 120 may be separated from substrate 110 by self-separation, by laser lift-off, by void-assisted separation, by selective dissolution of substrate 110, or by another method that is known in the art. The top surface of the boule may have a (0001) Ga-face, c-plane orientation, may have an x-ray diffraction ω-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. In some embodiments, the threading dislocations in the top surface of boule 120 are approximately uniformly distributed. In other embodiments, the threading dislocations in the top surface of boule 120 are arranged inhomogenously as a one-dimensional array of rows of relatively high- and relatively low-concentration regions or as a two-dimensional array of high-dislocation-density regions within a matrix of low-dislocation-density regions. The crystallographic orientation may be constant to less than about 2 degrees, less than about 1 degree, less than about 0.5 degree, less than about 0.2 degree, less than about 0.1 degree, or less than about 0.05 degree across the top surface of the boule. An example of a suitable thick GaN boule is described by Fujito et al., J. Cryst. Growth, 311, 3011 (2009), and by Fujito et al., Mater. Res. Soc. Bull. 34, 313 (2009), which are hereby incorporated by reference in their entirety.

One or more proto-seeds 130 may be prepared from boule 120 by sawing, slicing, cleaving, or the like. In a preferred embodiment, sawcutting is performed parallel to an m-direction, creating strips with long {11-20} surfaces. In some embodiments, the long surfaces prepared by the sawcutting operation have a crystallographic orientation within 10 degrees, within 5 degrees, within 2 degrees, or within 1 degree of an a-plane, {11-20} orientation. In some embodiments, the sawcut or a-plane surfaces are lapped, polished, electrochemically polished, photoelectrochemically polished, reactive-ion-etched, and/or chemical-mechanically polished. The small-area ends of the proto-seeds may have an m-plane, {1-100} orientation, or may have a semi-polar {1-101} or {1-102} orientation. The proto-seed may contain several crystallites separated by low-angle grain boundaries but may be substantially free from coalescence fronts of the type observed in epitaxial lateral overgrowth. Of course, there can be other variations, modifications, and alternatives.

FIG. 1b illustrates an alternative embodiment for preparation of a proto-seed. After growing a thick GaN layer on substrate 110 using hydride vapor phase epitaxy (HVPE) or another method that is known in the art, forming boule 120, boule 120 is sliced into two or more wafers 140. Wafer 140 may have a thickness between about 0.1 millimeter and about 1 millimeter, or between about 0.3 millimeter and about 0.6 millimeter. Wafer 140 may be lapped, polished, electrochemically polished, photoelectrochemically polished, reactive-ion-etched, and/or chemical-mechanically polished. Of course, there can be other variations, modifications, and alternatives. The top surface of at least one wafer 140, and of proto-seed 150, may have a (0001) Ga-face, c-plane orientation, may have an x-ray diffraction ω-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. The crystallographic orientation may be constant to less than about 2 degrees, less than about 1 degree, less than about 0.5 degree, less than about 0.2 degree, less than about 0.1 degree, or less than about 0.05 degree across the top surface of the boule. One or more proto-seeds 150 may be prepared from wafer 140 by sawing, slicing, cleaving, or the like. In a preferred embodiment, sawcutting is performed parallel to an m-direction, creating strips with long {11-20} surfaces. In some embodiments, the long surfaces prepared by the sawcutting operation have a crystallographic orientation within 10 degrees, within 5 degrees, within 2 degrees, or within 1 degree of an a-plane, {11-20} orientation. In some embodiments, the sawcut or a-plane surfaces are lapped, polished, electrochemically polished, photoelectrochemically polished, reactive-ion-etched, and/or chemical-mechanically polished. The small-area ends of the proto-seeds may have an m-plane, {1-100} orientation, or may have a semi-polar {1-101} or {1-102} orientation. The proto-seed may contain several crystallites separated by low-angle grain boundaries but may be substantially free from coalescence fronts of the type observed in epitaxial lateral overgrowth. Of course, there can be other variations, modifications, and alternatives.

Referring to FIG. 2, the N-face or −c edge of the proto-seed may be trimmed by sawing, laser cutting, cleavage, lapping, or the like, among other techniques. Removal of 0.1-2 mm of the (000-1) edge may allow for removal of the region with the highest dislocation density, so that subsequent crystal growth may start with a dislocation density in the $10^7$ cm$^{-2}$ range or below, rather than in the $10^8$ cm$^{-2}$ to $10^9$ cm$^{-2}$ range. After removal of the edges, the newly formed edges may be lapped, polished, electrochemically polished, photoelectrochemically polished, reactive-ion-etched, and/or chemical-mechanically polished. Of course, there can be other variations, modifications, and alternatives. At least one of the Ga-face (0001) and N-face (000-1) surfaces may be lapped, polished, electrochemically polished, photoelectrochemically polished, reactive-ion-etched, and/or chemical-mechanically polished. The proto-seed may be at least 25 mm, at least 40 mm, at least 50 mm, at least 75 mm, at least 100 mm, at least 125 mm, at least 150 mm, at least 200 mm, or at least 250 mm long in the longest direction, which may be in an m-direction. The proto-seed may be at least 0.3 millimeter, at least 1 millimeter, at least 2 millimeters, at least 5 millimeters, at least 10 millimeters, at least 15 millimeters, or at least 20 millimeters thick in the c-direction. The proto-seed may be at least 0.3 millimeter, at least 1 millimeter, at least 2 millimeters, at least 5 millimeters, at least 10 millimeters, at least 15 millimeters, or at least 20 millimeters wide in the a-direction.

The proto-seed may have a total impurity concentration below $1 \times 10^{18}$ cm$^{-3}$. The proto-seed may have impurity concentrations of oxygen (O), hydrogen (H), carbon (C), sodium (Na), and potassium (K) below $1 \times 10^{17}$ cm$^{-3}$, $2 \times 10^{17}$ cm$^{-3}$, $1 \times 10^{17}$ cm$^{-3}$, $1 \times 10^{16}$ cm$^{-3}$, and $1 \times 10^{16}$ cm$^{-3}$, respectively, as quantified by calibrated secondary ion mass spectrometry (SIMS), glow discharge mass spectrometry (GDMS), interstitial gas analysis (IGA), or the like. In some embodiments the impurity concentration of oxygen is less than $3 \times 10^{16}$ cm$^{-3}$ or less than $1 \times 10^{16}$ cm$^{-3}$. In some embodiments the impurity concentration of hydrogen is less than $1 \times 10^{17}$ cm$^{-3}$ or less than $3 \times 10^{16}$ cm$^{-3}$. In some embodiments the impurity concentration of carbon is less than $3 \times 10^{16}$ cm$^{-3}$, less than $1 \times 10^{16}$ cm$^{-3}$, or less than $3 \times 10^{15}$ cm$^{-3}$. In some embodiments the impurity concentrations of sodium and of potassium are less than $3 \times 10^{15}$ cm$^{-3}$ or less than $1 \times 10^{15}$ cm$^{-3}$. The proto-seed may have impurity concentrations of fluorine (F) and chlorine (Cl) below $1 \times 10^{15}$ cm$^{-3}$ and $1 \times 10^{15}$ cm$^{-3}$, respectively. Of course, there can be other variations, modifications, and alternatives. The proto-seed is substantially free of stacking faults, with a concentration below 100 cm$^{-1}$. Other characteristics may also exist depending upon the specific embodiment.

In crystal growth processes, the impurity levels in seed crystals are similar to those in the crystal that is grown upon the seed. Such a process minimizes strains and possible deleterious effects such as misfit dislocation generation, unstable surface morphologies, and crack formation. Surprisingly, growth of bulk gallium nitride layers with a significant variation in impurity levels does not lead to severe consequences, as long as the variations are not too large, and offers significant benefits. In particular, this relative insensitivity to impurity gradients within a grown, composite gallium nitride crystal enables the crystal grower to take advantage of the different crystallographic growth-rate ratios achievable with different growth techniques and chemistries in order to grow large, high quality gallium nitride crystals. The composite gallium containing crystal may comprise at least a first region and a second region, the composite seed crystal being composed of a gallium containing material, the first region being characterized by a first set of impurity levels or concentrations and the second region being characterized by a second set of impurity levels or concentrations. The transition between the first set of impurity levels and the second set of impurity levels may occur within a transition thickness of less than about 100 microns, less than about 10 microns, or less than about 1 micron. In some embodiments, the composite crystal further comprises a third region, with a third set of impurity levels or concentrations. In still other embodiments, the composite crystal further comprises a fourth region, with a fourth set of impurity levels or concentrations. The transition between the second region and the third region, and/or between the third region and the fourth region, may occur within a transition thickness of less than about 100 microns, less than about 10 microns, or less than about 1 micron. In one or more embodiments, a concentration of at least one of hydrogen, oxygen, sodium, potassium, fluorine, or chlorine differs by at least a factor of three between the first region and the second region, between the second region and the third region, and/or between the third region and the fourth region. In one or more embodiments, a concentration of at least one of hydrogen, oxygen, sodium, potassium, fluorine, or chlorine differs by at least a factor of ten between the first region and the second region, between the second region and the third region, and/or between the third region and the fourth region. The composite gallium containing crystal may be formed using at least two, at least three, or at least four different growth chemistries and/or growth conditions. Again, there can be other variations, modifications, and alternatives.

In a specific embodiment, illustrated schematically in FIG. 3, proto-seed 330 is used as a seed crystal for ammonothermal growth, under conditions favoring growth in the a direction. For example, an opening or hole is laser-cut near one end of the non-polar slice seed crystal. The crystal is hung from a silver wire or other suitable technique inside a silver capsule below a baffle. Polycrystalline GaN raw material, $NH_4F$ mineralizer, and ammonia are added to the capsule with a ratio of approximately 15:1:8.5, but there can be other ratios according to a specific embodiment. The sealed capsule is placed in a cell in a zero-stroke high pressure apparatus or other suitable apparatus. The cell is heated at about 11 degrees Celsius per minute until the temperature of the bottom of the capsule is approximately 700 degrees Celsius and the temperature of the top half of the capsule is approximately 650 degrees Celsius, as measured by type K thermocouples according to a specific embodiment. The temperature of the top half of the heater is then increased until the temperature gradient $\Delta T$ decreases to zero. After holding at $\Delta T=0$ for 1 hour, the temperature of the top half of the capsule is decreased at 5 degrees Celsius per hour until $\Delta T$ increases to approximately 30 degrees Celsius, and the temperatures are held at these values for a predetermined time. In another specific embodiment, the semi-polar slice is used as a seed crystal for ammonothermal growth, under conditions favoring growth in the a direction.

In a specific embodiment, the cell is then cooled and removed from the zero-stroke high pressure apparatus. Cooling occurs by thermal conduction to a water-cooled element within the high pressure apparatus, according to a specific embodiment. The seed crystal grows in the a direction at a rate as high as about 60 micron per hour until the edges of the crystal become terminated by m planes, but can be higher or slightly lower in other applications. The m plane edges and the m-plane thickness of the crystal grow at a rate as high as about 17 microns per hour or greater, or slightly less according to a specific embodiment. In the example shown in FIG. 3, growth takes place principally in the [11-20] and [-1-120] directions, with a lesser amount of growth in the [1-100] and [-1100] directions and in the [0001] and [000-1] directions (latter not shown). The edges of the a planes begin to become terminated by m planes, e.g., (01-10) and (10-10) surrounding a (11-20) facet.

In one set of embodiments, growth on the a-planes occurs homogenously and the cross section of the newly-grown a-sector is greater than or approximately equal to the thickness of the proto-seed in the c-direction. In other embodiments, illustrated in the bottom half of FIG. 3, growth on the a-planes occurs inhomogeneously. Inhomogeneous growth may be favored under conditions when a-direction growth is particularly rapid, which may be desired for cost-effective growth of large-area gallium containing crystals. During inhomogeneous a-direction growth the +c and −c edges of the crystal may grow more rapidly in the a-direction than the middle portions of the a planes, forming upper and lower a-wings 340 and 350, respectively. Without wishing to be bound by theory, we believe that a higher rate of growth may originate at the edges due to convective effects as the supercritical ammonia flows over the at least one proto-seed. As the wings on the +c and −c edges of the a plane overgrow the space between them, transport of supercritical ammonia with dissolved gallium-containing precursors into the space is inhibited, resulting in an even greater differential in the a-direction growth rates of the wings relative to the region in between the wings. Inhomogeneous growth of the a-wings may enable growth of higher-quality gallium-containing crystals, as strain between the +c and −c edges of the wings may be greatly reduced or eliminated, and lateral growth of the upper a-wings 340 may occur from the region of the proto-seed 330 with the highest crystallographic quality.

In another embodiment, ammonothermal growth on the proto-seed is performed in an autoclave. In yet another embodiment, ammonothermal growth is performed in an internally-heated high pressure apparatus, as described in U.S. patent application Ser. Nos. 12/133,364, 12/133,365, and 61/075,723, which are hereby incorporated by reference in their entirety.

Referring to FIG. 4, the a-wings 440 and 450 may be separated from the proto-seed 430 by sawing, laser-cutting, slicing, cleaving, or the like. Cuts or slices may be performed parallel and proximal to the original a faces of the proto-seed 430. If inhomogeneous growth has occurred the +c and −c a-wings 440 and 450 may be separated from each other by sawing, laser-cutting, slicing, cleaving, or the like. The newly exposed surfaces, which may have an a {11-20} or a ±c (0001)/(000-1) orientation, may be lapped, polished, electrochemically polished, photoelectrochemically polished, reactive-ion-etched, and/or chemical-mechanically polished. In some embodiments, as shown in FIG. 4, separation of a-wings 440 and 450 is performed after they are grown out to a half-rhombus shape. In other embodiments, separation of a-wings 440 and 450 from proto-seed 430 is performed before a-wings have fully grown out to a half-rhombus shape. For example, referring to FIG. 3, the a-wings may be separated after performing an intermediate degree of lateral growth, as shown schematically in the middle panel of FIG. 3. For example, the a-wings may be separated after performing between about 0.5 mm and about 5 mm of lateral growth from proto-seed 330 or 430.

Referring to FIG. 5, one or more a-wings 540 may be used as a seed crystal for ammonothermal growth, under conditions favoring growth in the a direction. The growth rate in the a-direction may be significantly larger than the growth rates in the m-direction or c-directions, resulting in a substantially rhombus-shaped crystal 570 comprising original a-wing 540 and newly-grown a-wing 560. If the thickness of a-wing 540 was non-uniform, due to inhomogeneous growth in the a-direction, the variation in thickness may persist in growth of the rhombus-shaped crystal 570. If a-wing 540 was separated from the proto-seed prior to growing out to a full half-rhombus shape, a-direction growth may occur simultaneously on both a-edges of a-wing 540. The total extent of lateral growth, during at least one growth run, but possibly two, three, or more growth runs, may be greater than about 5 millimeters, greater than about 7.5 millimeters, greater than about 10 millimeters, greater than about 15 millimeters, greater than about 20 millimeters, greater than about 25 millimeters, greater than about 30 millimeters, greater than about 40 millimeters, or greater than about 50 millimeters. The original proto-seed 430, possibly with additional, epitaxially-grown material on the c-faces, a-faces, m-faces, and other faces, if present, may be used as a seed crystal for ammonothermal growth, under conditions favoring growth in the a direction. Ammonothermal growth on the re-grown proto-seed may be performed simultaneously, in the same apparatus, as growth on a-wing 540.

Rhombus crystal 570 may have a longest lateral dimension between about 25 millimeters and about 300 millimeters. Rhombus crystal 570 may have included angles of approximately 60 degrees or 120 degrees between adjacent m-plane facets. Rhombus crystal 570 may have a thickness between about 0.2 millimeter and about 25 millimeters. Rhombus crystal 570, which has been completely grown laterally with respect to the original c-plane proto-seed crystal, may have a c-plane dislocation density of about $10^0$-$10^5$ cm$^{-2}$ and a crystallographic radius of curvature greater than about 10 meters, greater than about 20 meters, greater than about 50 meters, or greater than about 100 meters. Rhombus crystal 570 may have an a-plane dislocation density that is greater by more than a factor of 10, greater by more than a factor of 100, or greater by more than a factor of 1000 than the dislocation density in a c-plane. In a specific embodiment, the top and bottom surfaces of the rhombus crystal may have impurity concentrations of O, H, C, Na, and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the top and bottom surfaces of the rhombus crystal may have impurity concentrations of O, H, C, and at least one of Na and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, the top and bottom surfaces of the rhombus crystal may have impurity concentrations of O, H, C, and at least one of F and Cl between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS). In some embodiments, the top and bottom surfaces of the rhombus crystal may have impurity concentrations of H between about $5\times10^{17}$ cm$^{-3}$ and $1\times10^{19}$ cm$^{-3}$, as quantified by calibrated secondary ion mass spectrometry (SIMS). In a specific embodiment, the rhombus crystal has an infrared absorption peak at about 3175 cm$^{-1}$, with an absorbance per unit thickness of greater than about 0.01 cm$^{-1}$. The rhombus crystal may contain several crystallites separated by low-angle grain boundaries but may be free from coalescence fronts of the type observed in epitaxial lateral overgrowth. In some embodiments, one or more corners of rhombus crystal 570 are missing but much of the rhombus outline is present, so that the crystal is substantially rhombus-shaped.

In a specific embodiment, the top surface of the rhombus crystal may be oriented to within 10 degrees, within 5 degrees, within 2 degrees, within 1 degree, within 0.3 degree, or within 0.1 degree of the (0001) Ga-face, c-plane orientation, may have an x-ray diffraction ω-scan rocking curve full-width-at-half-maximum (FWHM) less than about 40 arcsec, less than about 30 arcsec, or less than about 20 arcsec for the (0002) and/or the (10-12) reflections and may have a dislocation density less than about $10^5$ cm$^{-2}$, less than about $10^4$ cm$^{-2}$, less than about $10^3$ cm$^{-2}$, less than about $10^2$ cm$^{-2}$, or less than about 10 cm$^{-2}$. The crystallographic orientation may be constant to less than about less than about 1 degree, less than about 0.5 degree, less than about 0.2 degree, less than about 0.1 degree, or less than about 0.05 degree across the top surface of the rhombus crystal.

In a specific embodiment, the rhombus crystal is lapped, polished, electrochemically polished, photoelectrochemically polished, reactive-ion-etched, and/or chemical-mechanically polished according to methods that are known in the art. In another specific embodiment, the rhombus crystal is sliced approximately parallel to a large area surface to form one or more wafers. The wafers may be lapped, polished, electrochemically polished, photoelectrochemically polished, reactive-ion-etched, and/or chemical-mechanically polished according to methods that are known in the art.

In one specific embodiment, the rhombus crystal or a wafer formed therefrom is then used as a seed crystal or substrate for further bulk crystal growth, for example, for flux growth, or for HVPE growth. Some dislocations may form at or near the interface between the rhombus crystal and the newly grown GaN material and propagate in the growth direction. However, their concentration is relatively low, for example, below about $10^5$ cm$^{-2}$, below about $10^4$ cm$^{-2}$, below about $10^3$ cm$^{-2}$, below about $10^2$ cm$^{-2}$, or below about 10 cm$^{-2}$.

In another specific embodiment, illustrated schematically in FIG. 6, rhombus crystal 670 is separated into laterally-grown, strip-shaped crystals 680 by sawing, laser-cutting, slicing, cleaving, or the like. In some embodiments, the separation is performed approximately parallel to m-planes. Optionally, the newly created m-surfaces may be lapped, polished, electrochemically polished, photoelectrochemically polished, reactive-ion-etched, and/or chemical-mechanically polished according to methods that are known in the art. The strip-shaped crystals may be characterized by an upper (0001) surface, a lower (000-1) surface and four principal edges, all of which have an m-plane orientation. The length or maximum dimension of the strip-shaped crystals may be larger, by a factor of 5 or larger, a factor of 10 or larger, or a factor of 20 or larger, than the thickness and the width.

In another specific embodiment, laterally-grown strip-shaped crystals are prepared by slicing an a-wing or a rhombus-shaped crystal prepared by ammonothermal growth from a non gallium-based seed crystal, for example by the method described by Poblenz et al. in U.S. patent application Ser. No. 12/556,562 filed Sep. 9, 2009, which is hereby incorporated by reference in its entirety. Other means for preparing laterally-grown gallium based crystals are also possible.

In a specific embodiment, illustrated schematically in FIGS. 7*a*, 7*b*, and 7*c*, at least one strip-shaped crystal 780 or laterally-grown gallium based crystal is used as a seed crystal for ammonothermal growth under conditions favoring growth in the +c and/or −c directions. For example, if it is not already present, a hole (or opening or recessed region) may be laser-cut near one end or both ends of the strip-shaped seed crystal. The crystal is hung from a silver wire or other suitable technique inside a silver capsule below a baffle. Polycrystalline GaN raw material, $GaF_3$ mineralizer, and ammonia are added to the capsule with a ratio of approximately 10:1.1:8.5, but there can be other ratios according to a specific embodiment. The sealed capsule is placed in a cell in a zero-stroke high pressure apparatus or other suitable techniques. The cell is heated until the temperature of the bottom of the capsule is approximately 750 degrees Celsius and the temperature of the top half of the capsule is approximately 705 degrees Celsius, as measured by type K thermocouples. The temperatures are held at these values for a predetermined period of time. The cell is then cooled and removed from the zero-stroke high pressure apparatus. The seed crystal grows in the +c and −c directions at a rate of at least about 10 microns per hour. The two crystallographic directions are inequivalent in GaN, so the growth rates in the two directions may or may not be the same. Growth in the −c and −c directions may be continued until the dimension of the c-grown crystal along the c axis is within a factor of two, or approximately equal, to the length of the strip-shaped crystal or the largest width of the crystal in a direction perpendicular to the c axis.

The c-grown crystal may be terminated predominantly by two large m faces, by at least two smaller m faces, by two smaller c faces, and by at least two semipolar {10-1±1} faces, as shown schematically in FIGS. 7a, 7b, 7c, and 8. The area of each of the two largest m faces may be larger, by a factor of at least 3, at least 5, at least 10, at least 20, or at least 30, than the c faces. The total area of each of two smaller m faces may be equal, to within a factor of 1.5, a factor of 2, or a factor of 3, to the total area of the +c and −c faces. The total area of the semipolar {10-1-1} faces may be larger, by a factor of at least 1.5, a factor of at least 2, or a factor of at least 3, than the total area of the {10-11} faces.

In some embodiments, the c-grown crystal may be characterized by having two large m faces and four smaller m faces, the latter of whose areas are approximately equal, to within a factor of three or within a factor of two, rather than only two smaller m faces, as illustrated schematically in FIGS. 7a, 7b, 7c, and 8.

The c-grown crystal may contain several crystallites separated by low-angle grain boundaries but may be substantially free from coalescence fronts of the type observed in epitaxial lateral overgrowth. The c-grown crystal may have impurity concentrations of O, H, C, Na, and K below about $1\times10^{17}$ $cm^{-3}$, $2\times10^{17}$ $cm^{-3}$, $1\times10^{17}$ $cm^{-3}$, $1\times10^{16}$ $cm^{-3}$, and $1\times10^{16}$ $cm^{-3}$, respectively, as quantified by calibrated secondary ion mass spectrometry (SIMS), glow discharge mass spectrometry (GDMS), interstitial gas analysis (IGA), or the like. The c-grown crystal may have impurity concentrations of O, H, C, Na, and K between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, below $1\times10^{16}$ $cm^{-3}$, and below $1\times10^{16}$ $cm^{-3}$, respectively, as quantified by calibrated secondary ion mass spectrometry (SIMS). In another embodiment, the c-grown crystal may have impurity concentrations of O, H, C, and at least one of Na and K between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, and between about $3\times10^{15}$ $cm^{-3}$ and $1\times10^{18}$ $cm^{-3}$, respectively, as quantified by calibrated secondary ion mass spectrometry (SIMS). In still another embodiment, the c-grown crystal may have impurity concentrations of O, H, C, and at least one of F and Cl between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, and between about $1\times10^{15}$ $cm^{-3}$ and $1\times10^{17}$ $cm^{-3}$, respectively, as quantified by calibrated secondary ion mass spectrometry (SIMS).

In a specific embodiment, the c-grown crystal is characterized by a FWHM of the 1-100 x-ray rocking curve of at least one of the large area m-plane surfaces below 50 arcsec, below 40 arcsec, below 30 arcsec, or below 20 arcsec. The dislocation density on at least one large-area m-plane surface may be below $10^6$ $cm^{-2}$, below $10^5$ $cm^{-2}$, below $10^4$ $cm^{-2}$, below $10^3$ $cm^{-2}$, or below $10^2$ $cm^{-2}$. The dislocation density through a c-plane in the c-grown crystal may be below $10^5$ $cm^{-2}$, below $10^4$ $cm^{-2}$, below $10^3$ $cm^{-2}$, or below $10^2$ $cm^{-2}$. The c-grown crystal may have a crystallographic radius of curvature greater than about 10 meters, greater than about 20 meters, greater than about 50 meters, or greater than about 100 meters.

In some embodiments, the c-grown crystal is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HYPE. The further-grown crystal may be sliced, polished, and/or chemically-mechanically polished into wafers by methods that are known in the art.

The wafer may be incorporated into a semiconductor structure. The semiconductor structure may comprise at least one $Al_xIn_yGa_{(1-x-y)}N$ epitaxial layer, where $0 \leq x$, $y$, $x+y \leq 1$. The epitaxial layer may be deposited on the wafer, for example, by metalorganic chemical vapor deposition (MOCVD) or by molecular beam epitaxy (MBE), according to methods that are known in the art. The semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof. The gallium-nitride-based electronic device or optoelectronic device may be incorporated into a fixture, such as a luminaire.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein.

As an example, the crystal structures includes various impurity levels. The c-grown crystal has impurity concentrations of O, H, C, Na, and K below about 1×1017 cm-3, 2×1017 cm-3, 1×1017 cm-3, 1×1016 cm-3, and 1×1016 cm-3, respectively. In a specific embodiment, the c-grown crystal has impurity concentrations of O, H, C, Na, and K between about 1×1017 cm-3 and 1×1019 cm-3, between about $1\times10^{17}$ cm-3 and $2\times10^{19}$ cm-3, below $1\times10^{17}$ cm-3, below $1\times10^{16}$ cm-3, and below $1\times10^{16}$ cm-3, respectively. In other embodiments, the c-grown crystal has impurity concentrations of O, H, C, and at least one of Na and K between about $1\times10^{17}$ cm-3 and $1\times10^{19}$ cm-3, between about $1\times10^{17}$ cm-3 and $2\times10^{19}$ cm-3, below $1\times10^{17}$ cm-3, and between about $3\times10^{15}$ cm-3 and $1\times10^{18}$ cm-3, respectively. In further embodiments, the c-grown crystal has impurity concentrations of O, H, C, and at least one of F and Cl between about $1\times10^{17}$ cm-3 and $1\times10^{19}$ cm-3, between about $1\times10^{17}$ cm-3 and $2\times10^{19}$ cm-3, below $1\times10^{17}$ cm-3, and between about $1\times10^{15}$ cm-3 and $1\times10^{17}$ cm-3, respectively. In still other embodiments, the c-grown crystal is characterized by a FWHM of the 1-100 x-ray rocking curve of at least one of the large area m-plane surfaces below 50 arcsec, a dislocation density on at least one large-area m-plane surface below $10^6$ cm-2, and a dislocation density through a c-plane in the c-grown crystal below about $10^5$ cm-2. In yet other embodiments, the c-grown crystal has an infrared absorption peak at about 3175 cm-1, with an absorbance per unit thickness of greater than about 0.01 cm-1. In yet other embodiments, the c-grown crystal has a crystallographic radius of curvature greater than about 20 meters. In other embodiments, the present technique includes slicing the c-grown crystal approximately parallel to a large area surface to form one or more wafers and optionally utilizing the c-grown crystal or a wafer prepared therefrom as a seed crystal or substrate for further bulk crystal growth. In other embodiments, the method utilizes the c-grown crystal or a wafer prepared therefrom as a substrate for preparation of a semiconductor structure, which has at least one $Al_xIn_yGa_{(1-x-y)}N$ epitaxial layer, where $0 \leq x, y, x+y \leq 1$. Again, one of more of these various may be included.

In preferred embodiments, the present semiconductor material and structure may be incorporated in to one or more applications. As an example, the applications include a gallium-nitride-based electronic device or optoelectronic device, the gallium-nitride-based electronic device or optoelectronic device being selected from a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A method for forming a gallium based crystal, comprising:
providing a bar-shaped proto-seed, the bar-shaped proto-seed comprising a gallium based crystal having a +c surface, a −c surface and at least one surface having a crystallographic orientation within 10 degrees of an a-plane {11-20} orientation; and
subjecting the bar-shaped proto-seed to an ammonothermal growth process of a gallium based crystalline material to cause the proto-seed to grow inhomogeneously in at least one a-direction to form a gallium based crystal having at least one upper a-wing and at least one lower a-wing, wherein the upper a-wing comprises a +c surface and the upper a-wing and the lower a-wing are separated by a gap.

2. The method of claim 1, wherein the proto-seed has impurity concentrations of oxygen (O), hydrogen (H), carbon (C), sodium (Na), and potassium (K) below about $1\times10^{17}$ cm$^{-3}$, $2\times10^{17}$ cm$^{-3}$, $1\times10^{17}$ cm$^3$, $1\times10^{16}$ cm$^{-3}$, and $1\times10^{16}$ cm$^{-3}$, respectively.

3. The method of claim 1, wherein the upper a-wing is characterized by a dislocation density below $10^4$ cm$^{-2}$.

4. The method of claim 1, wherein each of the upper a-wing and the lower a-wing are characterized by a dislocation density below $10^4$ cm$^{-2}$.

5. The method of claim 1, wherein the proto-seed is provided by removing a seed crystal structure from a thick gallium and nitrogen containing substrate made using HVPE growth or wherein the proto seed is provided by removing a seed crystal structure from a thick gallium and nitrogen containing substrate made using ammonothermal growth.

6. The method of claim 1, further comprising separating at least one a-wing from the gallium based crystal and utilizing the separated a-wing as a seed crystal for ammonothermal crystal growth.

7. The method of claim 6, wherein the ammonothermal crystal growth produces a substantially rhombus-shaped gallium-based crystal with large-area c+ and c-surfaces with a surface area of at least 25 mm$^2$, the rhombus-shaped crystal having a top surface and a bottom surface.

8. The method of claim 7, wherein the top and bottom surfaces of the substantially rhombus-shaped crystal have impurity concentrations of O, H, C, Na, and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively.

9. The method of claim 7, wherein the top and bottom surfaces of the substantially rhombus-shaped crystal have impurity concentrations of O, H, C, and at least one of Na and K between about $1\times10^{17}$ cm$^{-3}$ and $1\times10^{19}$ cm$^{-3}$, between about $1\times10^{17}$ cm$^3$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively.

10. The method of claim 7, wherein the top and bottom surfaces of the substantially rhombus-shaped crystal have impurity concentrations of O, H, C, and at least one of F and Cl between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively.

11. The method of claim 7, wherein the substantially rhombus-shaped crystal has an infrared absorption peak at about 3175 cm$^{-1}$, with an absorbance per unit thickness of greater than about 0.01 cm$^{-1}$.

12. The method of claim 7, wherein the substantially rhombus-shaped crystal has a crystallographic radius of curvature greater than about 20 meters.

13. The method of claim 7, further comprising slicing the substantially rhombus-shaped crystal approximately parallel to a large area surface to form one or more wafers.

14. The method of claim 7, further comprising utilizing the substantially rhombus-shaped crystal or a wafer prepared therefrom as a seed crystal or substrate for further bulk crystal growth.

15. A method of manufacturing a semiconductor device, comprising utilizing a wafer prepared from the gallium-based crystal of claim 1 as a substrate for manufacture of a semiconductor structure, the semiconductor structure comprising at least one $Al_xIn_yGa_{(1-x-y)}N$ epitaxial layer, where $0 \leq x, y, x+y \leq 1$.

16. The method of claim 15, further comprising using the semiconductor structure in a gallium-nitride-based electronic device or optoelectronic device, the gallium-nitride-based electronic device or optoelectronic device being selected from a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, or combinations thereof.

17. The method of claim 7, further comprising slicing the substantially rhombus-shaped crystal into at least two laterally-grown strip-shaped crystals with at least two long edges characterized by a surface orientation within about 10 degrees of an m-plane.

18. The method of claim 17, further comprising utilizing the laterally-grown strip-shaped crystals as seeds for ammonothermal crystal growth and growing the crystals by at least 5 mm in the +/−c direction to form a c-grown crystal.

19. A method of manufacturing a semiconductor device, comprising utilizing a wafer prepared the substantially rhombus-shaped crystal of claim 7 as a substrate for manufacture of a semiconductor structure, the semiconductor structure comprising at least one $Al_xIn_yGa_{(1-x-y)}N$ epitaxial layer, where $0 \leq x, y, x+y \leq 1$.

20. The method of claim 19, further comprising using the semiconductor structure in a gallium-nitride-based electronic device or optoelectronic device, the gallium-nitride-based electronic device or optoelectronic device being selected from a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, or combinations thereof.

21. The method of claim 1, wherein the ammonothermal growth process includes the use of polycrystalline GaN material and a mineralizer comprising at least one of fluorine (F) and chlorine (Cl).

22. The method of claim 20, wherein the ammonothermal growth process is performed at a temperature of at least 650 degrees Celsius.

* * * * *